(12) United States Patent
Cai et al.

(10) Patent No.: US 11,047,943 B2
(45) Date of Patent: Jun. 29, 2021

(54) METHOD FOR LONGITUDINAL RELAXATION TIME MEASUREMENT IN INHOMOGENEOUS FIELDS

(71) Applicant: XIAMEN UNIVERSITY, Xiamen (CN)

(72) Inventors: Shuhui Cai, Xiamen (CN); Hao Chen, Xiamen (CN); Zhong Chen, Xiamen (CN)

(73) Assignee: XIAMEN UNIVERSITY, Xiamen (CN)

( * ) Notice: Subject to any disclaimer, the term of this patent is extended or adjusted under 35 U.S.C. 154(b) by 347 days.

(21) Appl. No.: 16/084,492

(22) PCT Filed: Dec. 27, 2017

(86) PCT No.: PCT/CN2017/118986
§ 371 (c)(1),
(2) Date: Sep. 12, 2018

(87) PCT Pub. No.: WO2018/184409
PCT Pub. Date: Oct. 11, 2018

(65) Prior Publication Data
US 2020/0300950 A1   Sep. 24, 2020

(30) Foreign Application Priority Data

Apr. 7, 2017 (CN) .......................... 201710222672.0

(51) Int. Cl.
*G01R 33/50* (2006.01)
*G01R 33/46* (2006.01)
(Continued)

(52) U.S. Cl.
CPC ......... *G01R 33/50* (2013.01); *G01R 33/4633* (2013.01); *G01R 33/5608* (2013.01); *G01R 33/5615* (2013.01)

(58) Field of Classification Search
CPC ................ G01R 33/4633; G01R 33/50; G01R 33/5608; G01R 33/5615
See application file for complete search history.

(56) References Cited

U.S. PATENT DOCUMENTS

2007/0194788 A1* 8/2007 Pines .................... G01R 33/385
324/307
2008/0024128 A1* 1/2008 Song .................. G01R 33/5617
324/307
(Continued)

FOREIGN PATENT DOCUMENTS

CN       102116856 A       7/2011
CN       103091345 A       5/2013
(Continued)

OTHER PUBLICATIONS

Zhang et al., "Apparent longitudinal relaxation in solutions with intermolecular dipolar interactions and slow chemical exchange", Chem. Phys. Lett., 446: 223-227 (2007).
(Continued)

*Primary Examiner* — Gregory H Curran
(74) *Attorney, Agent, or Firm* — Cooper Legal Group, LLC

(57) ABSTRACT

A protocol to determine chemical shift-specific Ti constants in inhomogeneous magnetic fields is provided. Based on intermolecular double-quantum coherences and spatial encoding techniques, the method can resolve overlapped NMR spectral peaks in inhomogeneous magnetic fields acquired using conventional methods. With inversion recovery involved, the amplitude of spectral peak will be modulated by inversion recovery time. After fitting the spectral peak amplitude variation curve, the corresponding longitudinal relaxation time can be achieved. With the measured $T_1$ values in inhomogeneous magnetic fields, insights into
(Continued)

chemical exchange rates, signal optimization, and data quantitation can be obtained.

9 Claims, 3 Drawing Sheets

(51) Int. Cl.
    *G01R 33/56*     (2006.01)
    *G01R 33/561*     (2006.01)

(56) References Cited

U.S. PATENT DOCUMENTS

| | | |
|---|---|---|
| 2008/0150532 A1 | 6/2008 | Slavin et al. |
| 2010/0001727 A1* | 1/2010 | Frydman ............ G01R 33/5617 324/310 |
| 2011/0137612 A1 | 6/2011 | Wang et al. |
| 2015/0301140 A1 | 10/2015 | Lee et al. |

FOREIGN PATENT DOCUMENTS

| | | |
|---|---|---|
| CN | 103744042 A | 4/2014 |
| CN | 103685013 A | 6/2014 |
| CN | 103941204 A | 7/2014 |
| CN | 103941205 A | 7/2014 |
| CN | 104331681 A | 2/2015 |
| CN | 105259198 A | 1/2016 |
| CN | 107015181 A | 8/2017 |
| GB | 2440628 B | 2/2011 |
| JP | 2006149563 A | 6/2006 |

OTHER PUBLICATIONS

Chen et al., "Fast acquisition of high-resolution NMR spectra in inhomogeneous fields via intermolecular double-quantum coherences", J. Chem. Phys., 130: 084504 (2009).
Chen et al., "Quantitative characterization of intermolecular dipolar interactions of two-component systems in solution nuclear magnetic resonance", J. Chem. Phys., 115: 10769-10779 (2001).
Chen et al., "Quantitative study of longitudinal relaxation related to intermolecular dipolar interactions in solution NMR", Chem. Phys. Lett., 333: 126-132 (2001).
"High-Resolution NM Spectra in Inhomogeneous Fields via IDEAL (Intermolecular Dipolar-Interaction Enhanced All Lines) Method"; Dec. 2013; Zhong Chen, Zhiwei Chen and Jianhui Zhong; Journal of American Chemical Society, Issue 126 No. 2, pp. 446-447.
Book: "Theory and Application of Nuclear Magnetic Resonance Logging", Jan. 2010, Kejun Deng, 4 pgs.
"Research Progress of High-Resolution Nuclear Magnetic Resonance Methods Under Inhomogeneous Magnetic Fields Based on Intermolecular Multi-Quantum Coherence", Oct. 2008, Zhong Chen, Science in Chinese Press, pp. 1273-1286.
Article: "High Resolution Absorptive NMR Spectroscopy in Inhomogeneous Fields"; Aug. 2014; Zhang Liandi, English Abstract on p. 10, 75 pgs.

* cited by examiner

METHOD FOR LONGITUDINAL RELAXATION TIME MEASUREMENT IN INHOMOGENEOUS FIELDS

FIELD OF THE INVENTION

The present invention is directed to a nuclear magnetic resonance (NMR) spectroscopy detection method and more particularly to such a method to retrieve chemical shift information of NMR spectroscopy in inhomogeneous magnetic fields and then measure the longitudinal relaxation time of protons.

DESCRIPTION OF RELATED ART

Serving as a noninvasive detection tool, NMR has been widely used in chemistry, biology, and medicine. In a magnetic field, every nuclear spin has its specific longitudinal relaxation time ($T_1$). Longitudinal relaxation time reveals the dynamics of spin systems and is of great importance in NMR examination. Knowledge of longitudinal relaxation time will guide the studies of chemical exchange, data quantitation, and the optimization of data acquisition. However, in inhomogeneous magnetic fields, NMR spectra are subject to spectral line broadening and overlapping. Then chemical shift information becomes inaccessible, hampering assignment of spectral peaks, thus blocking the access to chemical shift-specific $T_1$ values. Intermolecular multiple-quantum coherences have been proposed to retrieve high-resolution NMR spectra in inhomogeneous magnetic fields, abating the spectral line broadening and overlapping caused by inhomogeneous magnetic fields, and gaining high-resolution one-dimensional (1D) proton spectra with chemical shift information retrieved.

SUMMARY OF THE PRESENT DISCLOSURE

A primary object of the present invention is to reduce the spectral line broadening and overlapping caused by magnetic field inhomogeneity and retrieve chemical shift information, thus providing an approach for proton longitudinal relaxation time measurement in inhomogeneous magnetic fields.

The steps of the present invention comprise:

(a) Putting the sample into an NMR tube, and placing the NMR tube into a magnetic resonance spectrometer.

(b) Running the spectrometer operation software on the console computer. Using conventional 1D proton pulse sequence to acquire a 1D proton spectrum to gain the distribution of spectral peaks and the spectral width. Then tune and match the radio frequency (RF) coil.

(c) Calibrating the length of non-selective $\pi/2$ RF pulse and the length and power of solvent-selective $(\pi/2)^I$ RF pulse.

(d) Importing the pulse sequence into the spectrometer console. Activating the modules for inversion recovery, spatial encoding, intermolecular double-quantum coherence signal selection, and spatial decoding.

(e) Checking and setting up the parameters of the pulse sequence, then starting data acquisition.

(f) Once spectral data acquisition is done, applying two-dimensional (2D) spectrum shearing and accumulated projection to the raw data, thus getting a set of 1D spectra with high-resolution chemical shift information whose amplitudes are modulated by the inversion recovery time.

(g) Fitting the amplitude variation curve for each spectral peak to obtain longitudinal relaxation time.

Wherein in step (b), the conventional 1D proton pulse sequence comprises a non-selective $\pi/2$ RF pulse. The distribution of spectral peaks and spectral width can be observed in the 1D proton spectrum. Then adjusting the RF pulse transmit offset to the center of the solvent spectral peak.

Wherein in step (c), the calibration of pulse length of the non-selective $\pi/2$ RF pulse is implemented by measuring the length of RF pulse completely flipping the magnetization from the longitudinal direction onto the transverse plane. Transforming the pulse shape in 1D proton pulse sequence to Gaussian and calibrating the pulse length and power of the solvent-selective $(\pi/2)^I$ RF pulse.

Wherein in step (d), the inversion recovery module comprises a solvent-selective $(\pi)^I$ RF pulse, a non-selective $\pi$ pulse and an inversion recovery time $\Delta$. The spatial encoding module comprises two identical adiabatic chirp RF pulses and a pair of dipolar gradients. The intermolecular double-quantum coherence signal selection module comprises a coherence selection gradient $G_1$, a solvent-selective $(\pi/2)^I$ RF pulse, a coherence selection gradient $G_2$, and a spin echo unit $\delta$-$\pi$-$\delta$, where the area ratio of gradients $G_1$ and $G_2$ is 1:(−2). The spatial decoding module comprises a pair of dipolar gradients which are applied in the acquisition period.

Wherein in step (e), the parameters of the pulse sequence comprise the length of non-selective $\pi/2$ pulse, the length and sweep bandwidth of adiabatic chirp RF pulses, the strength of encoding gradient $G_e$, the length and strength of the gradients $G_1$ and $G_2$, the length and power of the solvent-selective $(\pi/2)^I$ RF pulse, the power of solvent-selective $(\pi)^I$ RF pulse, the echo delay $\delta$, the acquisition points (np1) in the spatial decoding module, the number of repetition times ($N_a$) of the spatial decoding module, the strength of decoding gradient $G_a$, the repetition time TR, and the inversion recovery time $\Delta$. The experimental parameters for $T_1$ measurement include a set of varied inversion recovery times.

Wherein in step (f), when the data acquisition is done, the raw data of each ultrafast 2D spectrum are reconstructed to a 2D matrix with a size of np1×$N_a$ (np1 corresponds to the size of spatial encoding dimension F1 and $N_a$ corresponds to the size of direct detection dimension F2), and the 2D spectrum is gained after fast Fourier transform (FFT); rotating each 2D spectrum 45° counter-clockwise and making accumulated projection along the spatial encoding dimension, thus a set of high-resolution 1D spectra are attained; measuring the amplitude of each spectral peak and then normalizing the amplitudes, setting the amplitudes of the data points before the minimum amplitude to be negative, and plotting the curves in which the amplitudes of spectral peaks vary with the inversion recovery time $\Delta$.

Wherein in step (g), the amplitude vs. $\Delta$ curve plotted in step (f) is fitted with the function $y=a-b\times\exp(-x/T_1)$ in a computer, where the variable x is the inversion recovery time $\Delta$ and the function value y is the amplitude of spectral peak. The values of a, b and $T_1$ are obtained with a three-parameter fitting, and $T_1$ is the longitudinal relaxation time of protons corresponding to the spectral peak.

The present invention takes advantage of the intermolecular double-quantum coherences between solvent and solute spins along with the spatial encoding ultrafast acquisition protocol, and proposes a method which enables the measurement of proton longitudinal relaxation time in inhomogeneous magnetic fields. The present invention can narrow down spectral line broadening in inhomogeneous magnetic fields, retrieve the chemical shift information, and hence accurately measure the longitudinal relaxation time of protons.

In the presence of magnetic field inhomogeneity, spectral peaks are broadened and overlapped, obstructing the recognition of spectral peaks and the measurement of proton longitudinal relaxation time. Based on intermolecular double-quantum coherences and spatial encoding techniques, the present invention can resolve spectral peaks in inhomogeneous magnetic fields, whereas the spectral peaks are overlapped when acquired by conventional methods. With inversion recovery involved, the amplitudes of spectral peaks will be modulated by the inversion recovery time. After fitting variation curves of spectral peak amplitudes with inversion recovery time, the corresponding $T_1$ values can be achieved. With the measured $T_1$ values in inhomogeneous magnetic fields, insights into the chemical exchange rates, signal optimization, and data quantitation can be obtained.

DESCRIPTION OF THE PREFERRED EMBODIMENTS

Embodiments of the present invention are illustrated in further detail below as examples to explain the object, technical solution, and advantages thereof.

The present invention can be implemented on any suitable equipment, and the preferred embodiment has been implemented on a Varian NMR System 500 MHz spectrometer (Varian, Palo Alto, Calif., USA). The sample is 1.0 M 1-butanol aqueous solution, in which 1-butanol serves as solute and water serves as solvent.

Figure 1:
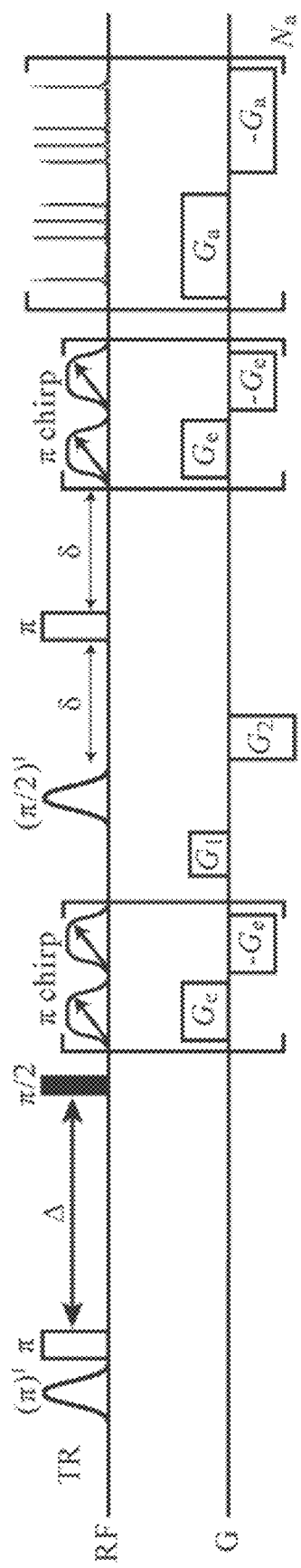
FIG. 1 is a diagram of the designed pulse sequence for proton longitudinal relaxation time measurement in inhomogeneous magnetic fields.
Figure 2:
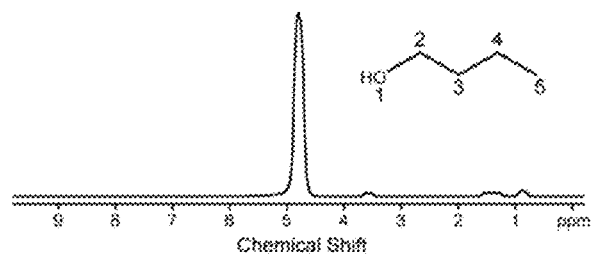
FIG. 2 is a 1D spectrum of a 1-butanol aqueous solution acquired using a 1D proton pulse sequence in an inhomogeneous field which imposed 100 Hz line broadening on spectral peaks. The structure of 1-butanol is given at the upper right, in which proton groups are labelled by numbers.

The designed pulse sequence for the measurement of proton longitudinal relaxation time in inhomogeneous magnetic fields (as shown in FIG. 1) comprises an inversion recovery module, a non-selective π/2 RF pulse, two spatial encoding modules, an intermolecular double-quantum coherence signal selection module, and a spatial decoding module. The inversion recovery module comprises a solvent-selective $(\pi)^I$ RF pulse, a non-selective π RF pulse, and an inversion recovery time Δ. The spatial encoding module comprises two identical adiabatic chirp RF pulses and a pair of dipolar gradients ($G_e$ and $-G_e$). The intermolecular double-quantum coherence signal selection module comprises a gradient $G_1$, a solvent-selective $(\pi/2)^I$ RF pulse, a gradient $G_2$, and a spin echo unit δ-π-δ, where the area ratio of gradients $G_1$ and $G_2$ is 1:(−2). The spatial decoding module comprises a pair of dipolar gradients ($G_a$ and $-G_a$) which are applied in the acquisition period.

The present invention is a method for the measurement of proton longitudinal relaxation time in inhomogeneous magnetic fields, and the longitudinal relaxation time of 1-butanol protons in an inhomogeneous field is obtained according to the procedure of the following steps (a) to (i).

(a) Putting some 1-butanol aqueous solution (about 0.6 mL) into a 5 mm NMR (nuclear magnetic resonance) tube, and placing the NMR tube into the NMR spectrometer.

(b) Acquiring a proton NMR spectrum of the solution using a one-dimensional (1D) proton pulse sequence to gain the distribution of spectral peaks and the spectral width of 1-butanol aqueous solution.

(c) Tuning the probe of the NMR spectrometer.

(d) Using the 1D proton pulse sequence to measure the length of non-selective π/2 pulse, which is 15 µs, and using a Gaussian-shaped RF pulse to measure the length and power of solvent-selective $(\pi/2)^I$ RF pulse, which are 5 ms and 19 dB. Setting the length of solvent-selective $(\pi)^I$ RF pulse as 5 ms and the power as 25 dB.

(e) Loading the designed pulse sequence for proton longitudinal relaxation time measurement in inhomogeneous magnetic fields (as shown in FIG. 1) into the NMR spectrometer.

(f) Setting up parameters of the designed pulse sequence and acquiring data as follows: the duration of each adiabatic chirp RF pulse is 10 ms, the sweep width of each adiabatic chirp RF pulse is 20 kHz; the strength of encoding gradients $G_e$ is 3.9 G/cm; the strength of coherence selection gradient $G_1$ is 10 G/cm with a duration of 1.5 ms; the strength of coherence selection gradient $G_2$ is −20 G/cm with a duration of 1.5 ms; the length of delay δ is 24 ms; the number of repetition times $N_a$ of the spatial decoding module is 180 ($N_a$=180); the number of acquisition points (np1) is 75; the strength of decoding gradient $G_a$ is 5.9 G/cm; the repetition time TR is 20 s; the experiments were performed with fourteen different inversion recovery times (Δ=0.0625, 0.125, 0.25, 0.5, 1, 1.5, 2, 2.5, 3, 4, 6, 8, 16, 32 s). There were fourteen 2D spectra recorded taking 7.5 min.

Figure 3:
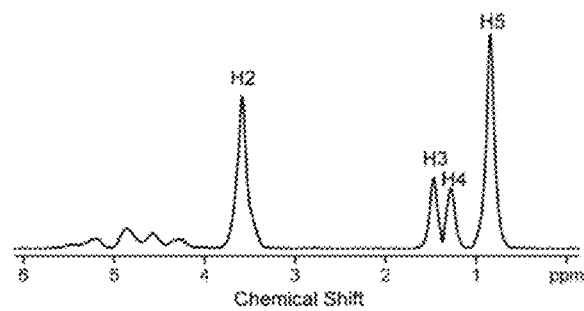
FIG. 3 is a high-resolution 1D spectrum obtained by rotating and projecting a 2D spectrum acquired using the designed pulse sequence in the present invention. The inversion recovery time is 32 s.
Figure 4:
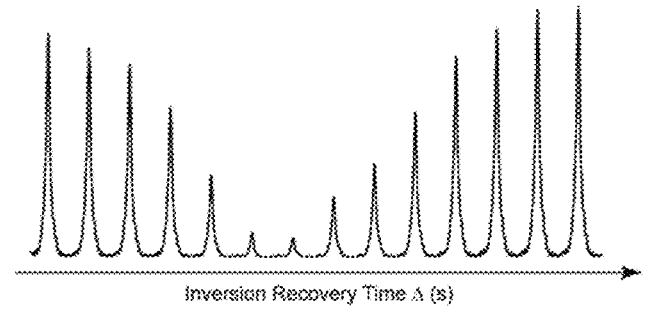
FIG. 4 shows the variation of absolute amplitude of butanol-H2 spectral peak with inversion recovery time Δ detected by the present invention.

(g) Processing the acquired data as follows: rearranging each spectral data to a 2D matrix with a size of np1×$N_a$; fast Fourier transforming (FFT) the matrix along the dimension of $N_a$ to obtain a 2D spectrum; rotating each 2D spectrum 45° counter-clockwise and making an accumulated projection along the dimension of np1, thus producing a set of high-resolution 1D spectra (see FIG. 3 for an example); and assigning the spectral peaks to corresponding protons according to the chemical shifts. FIG. 4 displays the variation of the absolute amplitude of butanol-H2 spectral peak with the inversion recovery time Δ.

Figure 5:
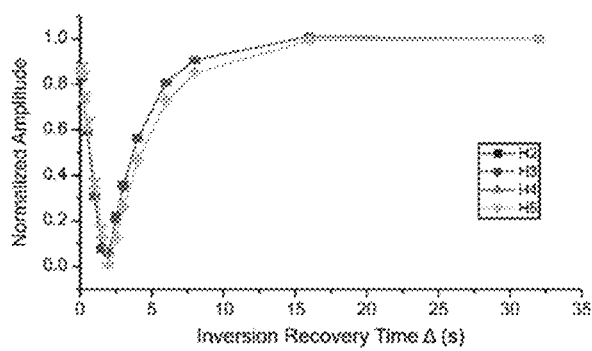
FIG. 5 shows the variation curves of absolute amplitude of each solute spectral peak with inversion recovery time Δ.

(h) Measuring the absolute amplitudes of each butanol spectral peak under different inversion recovery time Δ, normalizing the amplitudes with reference to the absolute amplitude of the spectral peak when Δ is 32 s, and plotting the variation curves of absolute spectral peak amplitudes with Δ, as shown in FIG. 5. As the 2D spectra are displayed in absolute value mode, the curves in FIG. 5 cannot represent the actual variation of spectral peak amplitudes. Setting the spectral peak amplitudes before the minimum spectral peak amplitude to be negative, and plotting the variation curves of spectral peak amplitudes with the inversion recovery time Δ, as displayed in FIG. 6.

Figure 6:
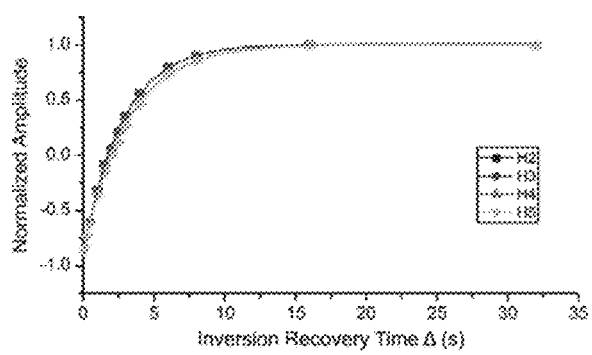
FIG. 6 shows the variation curves of amplitude of each solute spectral peak with inversion recovery time Δ, in which the amplitudes before the minimum amplitude are set to be negative.

(i) Fitting the variation curves of spectral peak amplitudes with inversion recovery time Δ plotted in FIG. 6 with the function y=a−b×exp(−x/T$_1$) in a computer, where the variable x is the inversion recovery time Δ and the function value y is the amplitude of solute spectral peak. The values of a, b and T$_1$ are obtained after fitting, and T$_1$ is the longitudinal relaxation time of protons to be measured. The obtained T$_1$ values of 1-butanol protons (H2, H3, H4, H5) are 2.73, 2.77, 3.08 and 3.18 s, respectively.

In summary, the present invention provides a method for measurement of proton longitudinal relaxation time in inhomogeneous magnetic fields. With the advantage of intermolecular double-quantum coherence, the measurement method reduces the spectral line broadening and overlapping caused by the inhomogeneity of magnetic fields and retrieves chemical shift information. In conjunction with inversion recovery, spectral peak amplitude varies with inversion recovery time, and longitudinal relaxation time of protons can be figured out by numeric fitting. With the knowledge of longitudinal relaxation time measured by the present invention, strong signals could be suppressed and weak signals could be retrieved. Furthermore, the knowledge of longitudinal relaxation time can potentially provide insights into chemical exchange rates in inhomogeneous magnetic fields, and is of great significance to signal optimization and data quantification. It has wide application and good industrial practicability.

What is claimed is:

1. A method for measuring longitudinal relaxation time of protons in inhomogeneous magnetic fields, the method comprising:
   (a) putting a sample to be tested into a nuclear magnetic resonance (NMR) tube, and placing the NMR tube into an NMR spectrometer;
   (b) acquiring a proton NMR spectrum using a one-dimensional (1D) proton NMR pulse sequence to gain a distribution of spectral peaks and a spectral width of the sample to be tested, and then tuning a probe of the NMR spectrometer;
   (c) measuring a length of a non-selective π/2 radio-frequency (RF) pulse along with a length and a power of a solvent-selective (π/2)$^I$ RF pulse;
   (d) loading a designed pulse sequence into the NMR spectrometer comprising an inversion recovery module, the non-selective π/2 RF pulse, two spatial encoding modules, an intermolecular double-quantum coherence signal selection module, and a spatial decoding module;
   (e) setting up parameters of the designed pulse sequence, and then using the designed pulse sequence to acquire a set of spectral data of the sample to be tested;
   (f) processing the set of spectral data to obtain a set of 1D spectra with chemical shift information and spectral peak amplitudes modulated by an inversion recovery time;
   (g) measuring absolute amplitudes of each of solute spectral peaks under different inversion recovery times and then normalizing, setting the absolute amplitudes before a minimum amplitude to be negative, and plotting variation curves of the absolute amplitudes with the inversion recovery time for each of the solute spectral peaks; and
   (i) fitting the variation curves to obtain the longitudinal relaxation time of the protons.

2. The method of claim 1, wherein:
   measuring the length of the non-selective π/2 RF pulse comprises measuring a duration of a non-selective RF pulse to flip proton magnetization from a longitudinal direction onto a transverse plane, and
   measuring the length and the power of the solvent-selective (π/2)$^I$ RF pulse comprises measuring a duration and a power of the solvent-selective (π/2)$^I$ RF pulse to flip solvent proton magnetization from the longitudinal direction onto the transverse plane.

3. The method of claim 1, wherein the inversion recovery module comprises a solvent-selective (π)$^I$ RF pulse, a non-selective π RF pulse, and the inversion recovery time.

4. The method of claim 1, wherein each of the two spatial encoding modules comprises two identical adiabatic chirp RF pulses and a pair of first dipolar gradients.

5. The method of claim 1, wherein:
   the intermolecular double-quantum coherence signal selection module comprises a first gradient, the solvent-selective (π/2)$^I$ RF pulse, a second gradient, and a spin echo unit, and
   an area ratio of the first gradient and the second gradient is 1:(−2).

6. The method of claim 1, wherein the parameters of the designed pulse sequence comprise the length of the non-selective π/2 RF pulse, a length of a non-selective π RF pulse of the inversion recovery module, a length and a sweep bandwidth of two identical adiabatic chirp RF pulses of each of the two spatial encoding modules, a strength of a pair of first dipolar gradients of each of the two spatial encoding modules, a length and a strength of a first gradient and a second gradient of the intermolecular double-quantum coherence signal selection module, the length and the power of the solvent-selective (π/2)$^I$ RF pulse, a length and a power of a solvent-selective (π)$^I$ RF pulse of the inversion recovery module, echo delay, acquisition points in the spatial decoding module, a number of repetition times of the spatial decoding module, a strength of a pair of second dipolar gradients of the spatial decoding module, repetition time, and the inversion recovery time.

7. The method of claim 1, wherein:
   processing the set of spectral data comprises:
      rearranging each spectral data of the set of spectral data to a two-dimensional (2D) matrix having a first dimension np1 and a second dimension N$_a$;
      fast Fourier transforming (FFT) the 2D matrix along the second dimension N$_a$ to obtain a 2D spectrum;
      rotating each 2D spectrum 45° counter-clockwise,
      making an accumulated projection along the first dimension np1 to produce the set of 1D spectra.

8. The method of claim 1, wherein:
   fitting the variation curves comprises fitting using a three-parameter function y=a−b×exp(−x/T$_1$) in a computer to obtain values of a, b, and T$_1$, where x is the inversion recovery time, y is the absolute amplitude of each of the spectral peaks at a corresponding inversion recovery time, and T$_1$ is the longitudinal relaxation time of the protons.

9. The method according to claim 1, wherein the spatial decoding module comprises a pair of second dipolar gradients configured to be applied during acquiring the proton NMR spectrum.

* * * * *